United States Patent
Ikehashi

(10) Patent No.: US 7,145,284 B2
(45) Date of Patent: Dec. 5, 2006

(54) ACTUATOR AND MICRO-ELECTROMECHANICAL SYSTEM DEVICE

(75) Inventor: Tamio Ikehashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/178,494

(22) Filed: Jul. 12, 2005

(65) Prior Publication Data

US 2006/0220499 A1   Oct. 5, 2006

(30) Foreign Application Priority Data

Apr. 4, 2005   (JP)   ............... 2005-108004

(51) Int. Cl.
  H01K 41/053   (2006.01)
  H01K 41/09   (2006.01)
  H02N 2/00   (2006.01)

(52) U.S. Cl. .................. 310/348; 310/330; 310/332

(58) Field of Classification Search ................ 310/348, 310/332, 309, 330; 361/277; 359/223, 224, 359/225, 226, 843
  See application file for complete search history.

(56) References Cited

U.S. PATENT DOCUMENTS

| 6,242,989 B1 | 6/2001 | Barber et al. | |
| 6,359,374 B1 | 3/2002 | Dausch et al. | |
| 6,858,972 B1* | 2/2005 | Kikuchi et al. | 310/367 |
| 2003/0179535 A1 | 9/2003 | Shimanouchi et al. | |
| 2005/0128552 A1* | 6/2005 | Yasuda et al. | 359/223 |

FOREIGN PATENT DOCUMENTS

| JP | 8-242592 | 9/1996 |
| JP | 2004-6588 | 1/2004 |

* cited by examiner

Primary Examiner—Tom Dougherty
Assistant Examiner—Derek Rosenau
(74) Attorney, Agent, or Firm—Oblon, Spivak, McClelland, Maier & Neustadt, P.C.

(57) ABSTRACT

An actuator includes a movable beam supported on a substrate by a supporting portion, and having a first movable end and a second movable end. The second movable end is opposite to the first movable end with respect to the supporting portion. A first drive beam is connected to the movable beam at around the second movable end. The first drive beam is fixed on the substrate at an end portion of the first drive beam. A second drive beam is connected to the movable beam at a location between the supporting portion and the first movable end. The second drive beam is fixed on the substrate at another end portion of the second drive beam.

20 Claims, 17 Drawing Sheets

ACTUATOR AND MICRO-ELECTROMECHANICAL SYSTEM DEVICE

CROSS REFERENCE TO RELATED APPLICATIONS AND INCORPORATION BY REFERENCE

This application is based upon and claims the benefit of priority from prior Japanese Patent Application P2005-108004 filed on Apr. 4, 2005; the entire contents of which are incorporated by reference herein.

BACKGROUND OF THE INVENTION

1. Field of the Invention

The present invention relates to an actuator having a piezoelectric drive mechanism using a piezoelectric thin film. In particular, the present invention relates to a micro-electromechanical system device using a piezoelectric actuator.

2. Description of the Related Art

Recently, radio-frequency (RF) micro-electromechanical system (MEMS) devices such as a variable capacitor and a micro switch, which use actuators fabricated by MEMS technology, are being studied. The variable capacitor or the micro switch fabricated by the MEMS technology includes a movable electrode provided on a beam of an actuator having a movable end suported on a substrate, and a fixed electrode provided on a surface of the substrate, which faces the actuator. In the actuator, the beam is bent and displaced by a drive force, such as an electrostatic force, a thermal stress, an electromagnetic force, and a piezoelectric force, to vary the distance between the movable electrode and the fixed electrode. A variable capacitor and a micro switch using a piezoelectric actuator have been proposed (refer to Japanese Unexamined Patent Publication No. 2004-6588 and U.S. Pat. No. 6,359,374). The piezoelectric actuator using a piezoelectric thin film has the advantages of a low drive voltage and low power consumption. Accordingly, RF-MEMS devices having a piezoelectric actuator are suitable for a mobile instrument, such as a mobile phone.

A beam of the piezoelectric actuator has a multilayer structure including a piezoelectric film sandwiched by a top electrode and a bottom electrode. When the piezoelectric film is contracted or expanded by applying a voltage between the top and bottom electrodes, the beam is bent. Using the displacement obtained by bending the beam, the piezoelectric actuator may be operated as a variable capacitor or a micro switch.

When the piezoelectric actuator is used, it is necessary to prevent the beam from warping due to factors other than the intended expansion and contraction of the piezoelectric film. However, in the multilayer beam structure, warpage occurs due to various factors. For example, since individual films of the multilayer structure have different thermal expansion coefficients, the beam warps due to temperature changes. Further, when each film of the multilayer structure is deposited, different stresses occur in each film depending on the deposition method and material of the film. When the summation of the moments of membrane stress in the individual films is not zero, the beam warps.

The warpage of the beam due to the differences in thermal expansion coefficients can be prevented by stacking the films in such a manner that the distribution of the thermal expansion coefficients of the respective films is vertically symmetrically arranged in the stacking direction. However, in a unimorph-type piezoelectric actuator, material and thickness of each film is vertically asymmetrical in the stacking direction in order to bend the beam by a piezoelectric effect. Accordingly, it is difficult to control the distribution of the thermal expansion coefficients of the films to be vertically symmetric.

On the other hand, warpage due to a residual stress can be reduced by adjusting the multilayer structure and the thicknesses of the respective films so that the summation of the moments of stress in the multilayer structure is a predetermined value or less. Further, it is also necessary to take into consideration thickness variations in deposition of the films in the multilayer structure.

In the case of a typical piezoelectric actuator used in an RF-MEMS device, a length of a beam is approximately 100 µm, and the amount of displacement due to a piezoelectric effect is several µm. In a piezoelectric actuator having such dimensions, the thickness variation needs to be limited within one percent in order to control the amount of warpage, due to the residual stress, within 0.1 µm. The required magnitude of thickness variation is less than the thickness variation generated in a general semiconductor manufacturing process. In order to achieve the required magnitude of thickness variation, a special deposition system and a special process control are necessary. Further, it is necessary to control not only the thickness variation but also other factors relating to warpage, e.g., magnitudes of Young's modulus and the membrane stress in each film. Thus, in the manufacture of a piezoelectric actuator, many factors need to be controlled, and the cost of the end product increases.

SUMMARY OF THE INVENTION

A first aspect of the present invention inheres in an actuator including a movable beam supported on a substrate by a supporting portion, the movable beam having a first movable end and a second movable end, the second movable end provided opposite to the first movable end with respect to the supporting portion; a first drive beam connected to the movable beam at around the second movable end of the movable beam, the first drive beam fixed on the substrate at an end portion of the first drive beam; and a second drive beam connected to the movable beam at a location between the supporting portion and the first movable end of the movable beam, the second drive beam fixed on the substrate at an end portion of the second drive beam.

A second aspect of the present invention inheres in an actuator including a movable beam supported on a substrate by a supporting portion, the movable beam having a first movable end and a second movable end, the second movable end provided opposite to the first movable end with respect to the supporting portion; a first drive beam connected to the movable beam at around the second movable end of the movable beam, the first drive beam fixed on the substrate at an end portion of the first drive beam; a second drive beam connected to the movable beam at a location between the supporting portion and the first movable end of the movable beam, the second drive beam fixed on the substrate at an end portion of the second drive beam; and a fixed electrode located above the substrate so as to face the first movable end.

DETAILED DESCRIPTION OF THE INVENTION

Figure 1:
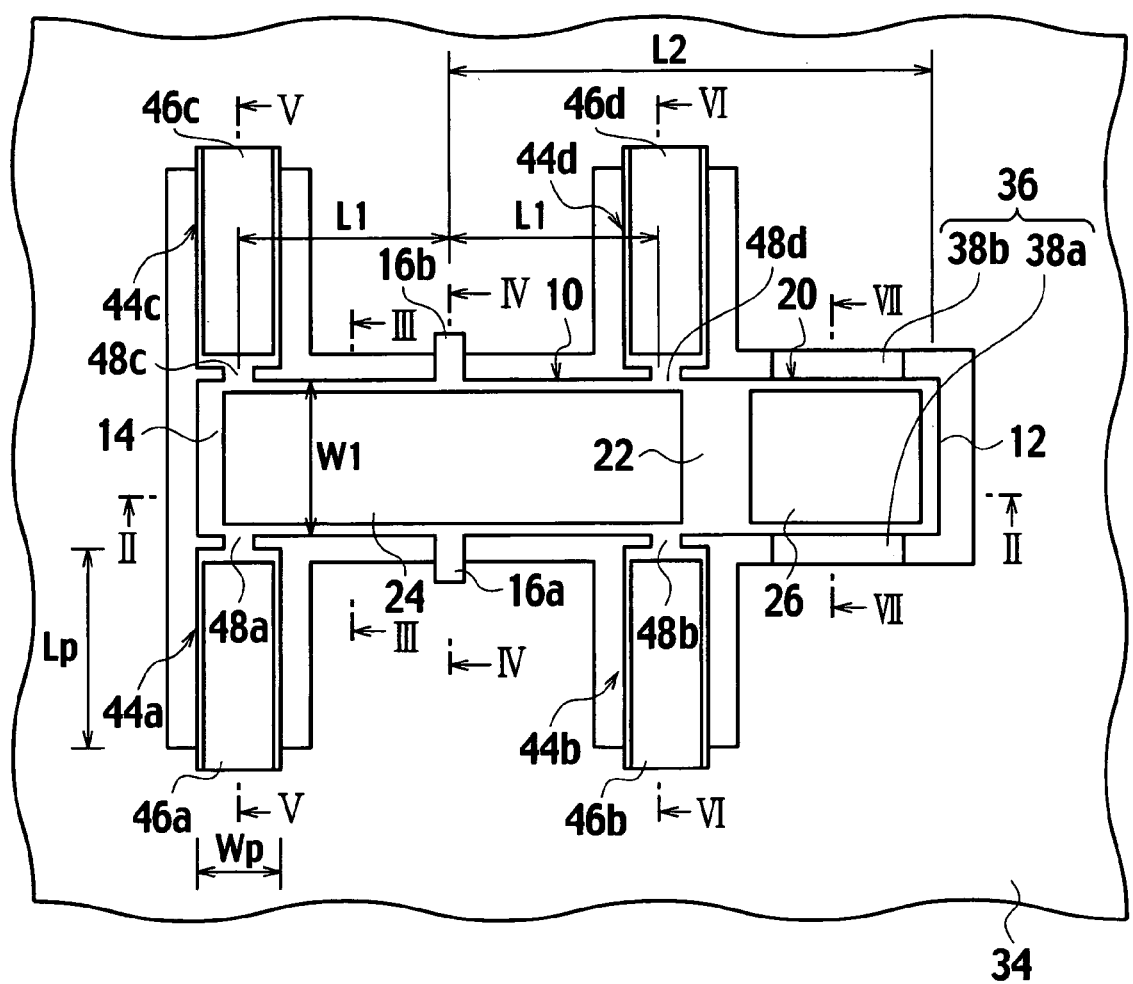
FIG. 1 is a schematic plan view showing an example of a MEMS device according to an embodiment of the present invention.

Various embodiments of the present invention will be described with reference to the accompanying drawings. It is to be noted that the same or similar reference numerals are applied to the same or similar parts and devices throughout the drawings, and the description of the same or similar parts and devices will be omitted or simplified.

A variable capacitor, as a MEMS device, according to an embodiment of the present invention includes an actuator having a movable electrode 26, and a fixed electrode 36, as shown in FIG. 1. The actuator includes a movable beam 10, a first drive beam 44a, a second drive beam 44b, a third drive beam 44c, a fourth drive beam 44d, and the like.

Figure 2:
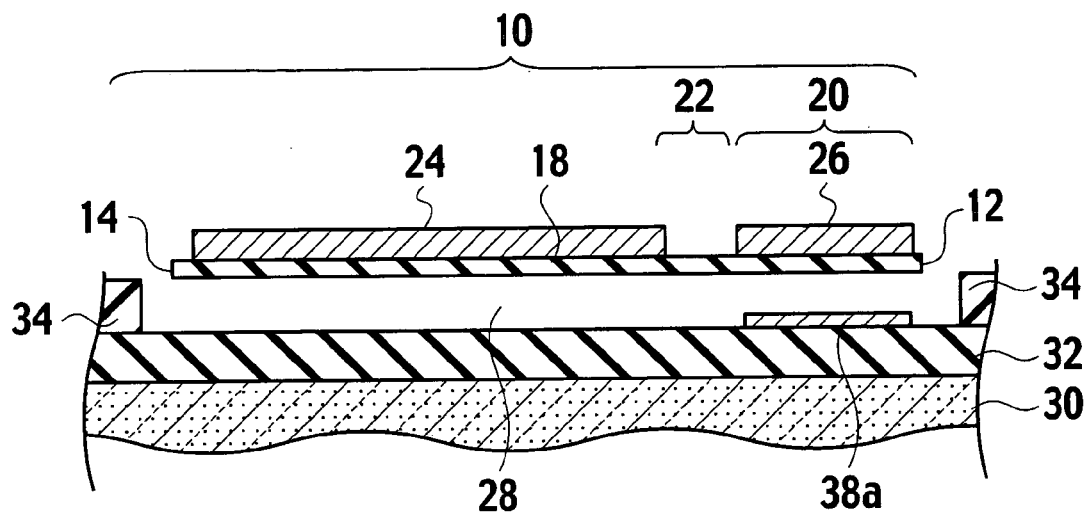
FIG. 2 is a schematic view showing an example of a cross section along a line II—II in the MEMS device of FIG. 1.
Figure 3:
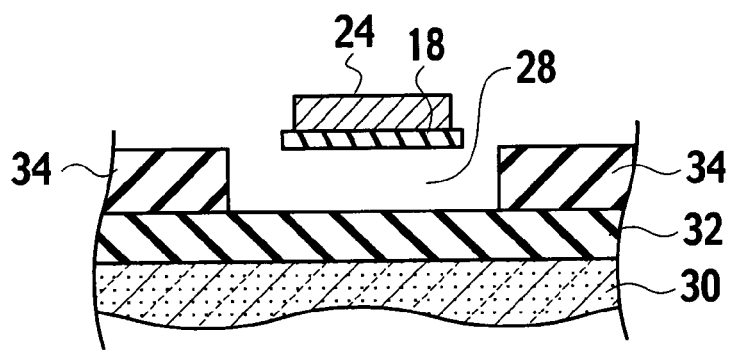
FIG. 3 is a schematic view showing an example of a cross section along a line III—III in the MEMS device of FIG. 1.
Figure 4:
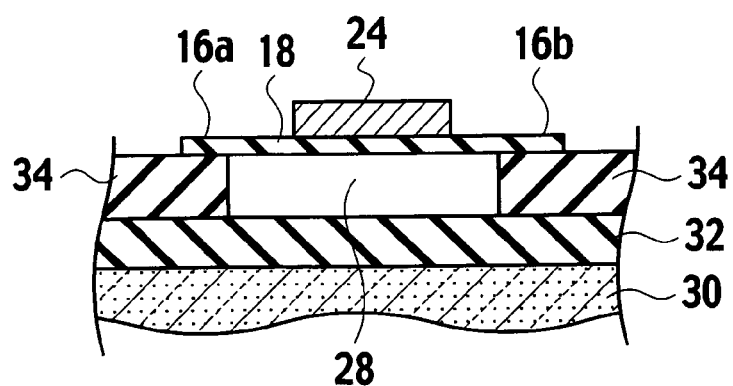
FIG. 4 is a schematic view showing an example of a cross section along a line IV—Iv in the MEMS device of FIG. 1.

As shown in FIGS. 2 to 4, the movable beam 10 is supported at supporting ends 16a, 16b of a supporting portion of a supporting film 18 that the movable beam 10 faces an underlying film 32 provided on a surface of a substrate 30. An air gap 28 separates the movable beam 10 from the underlying film 32 and substrate 30. A first movable end 12 is at an end of the movable beam 10 on a side of an acting portion 20 which is spaced from the supporting ends 16a, 16b. Further, a second movable end 14 is at the other end of the movable beam 10 opposite to the first movable end 12 with respect to the supporting ends 16a, 16b. The movable electrode 26 is placed in the acting portion 20 on the supporting film 18. The acting portion 20 can be displaced relative to the fixed electrode 36, which is placed on the substrate 30 to face the acting portion 20 (FIG. 1). A reinforcing film 24 is placed on the supporting film 18 between a connecting portion 22 and the second movable end 14 of the movable beam 10. The supporting ends 16a, 16b, which face each other in a direction orthogonal to the longitudinal direction of the movable beam 10, are fixed on an insulating film 34 provided on a surface of the underlying film 32.

Figure 5:
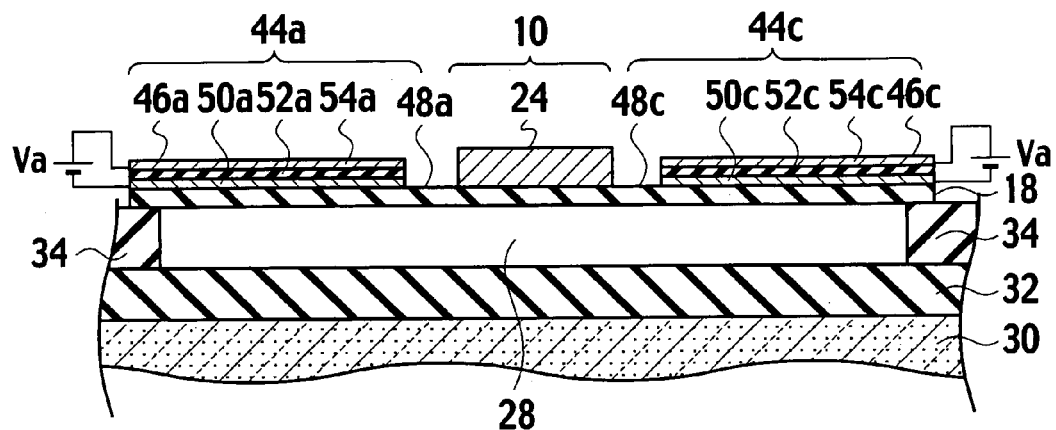
FIG. 5 is a schematic view showing an example of a cross section along a line V—V in the MEMS device of FIG. 1.

The first and third drive beams 44a, 44c are placed in the vicinity of the second movable end 14 located on the opposite side of the supporting ends 16a, 16b from the acting portion 20. As shown in FIG. 5, drive end portions 48a, 48c at ends of the first and third drive beams 44a, 44c, respectively, are connected to the movable beam 10 at a position between the supporting ends 16a, 16b and the second movable end 14. Fixed end portions 46a, 46c on the other ends of the first and third drive beams 44a, 44c, respectively, are fixed on the insulating film 34.

The first and third drive beams 44a, 44c include piezoelectric films 52a, 52c, bottom electrodes 50a, 50c, and top electrodes 54a, 54c. The piezoelectric films 52a, 52c are sandwiched between the bottom electrodes 50a, 50c, and the top electrodes 54a, 54c, respectively. In order to drive the first and third drive beams 44a, 44c, a drive voltage Va is applied between the bottom electrodes 50a, 50c and the top electrodes 54a, 54c.

Figure 6:
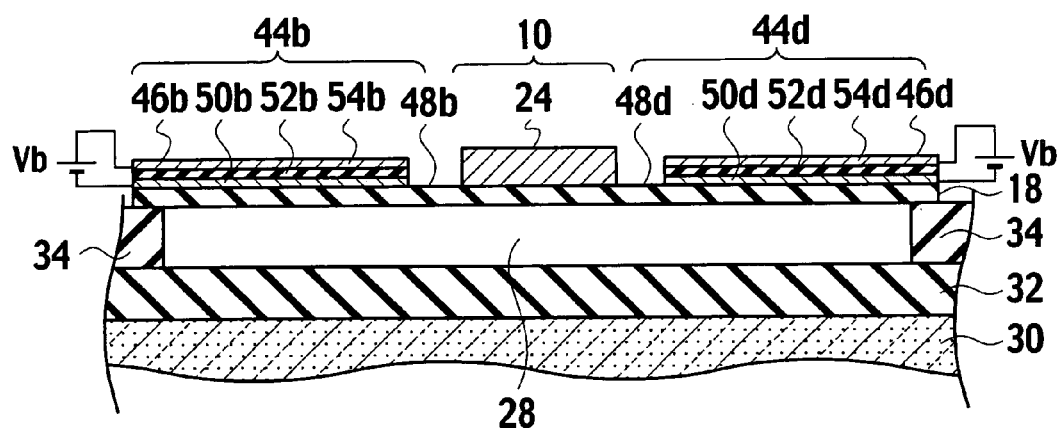
FIG. 6 is a schematic view showing an example of a cross section along a line VI—VI in the MEMS device of FIG. 1.

The second and fourth drive beams 44b, 44d are placed in a mirror symmetry with the first and third drive beams 44a, 44c with respect to the supporting ends 16a, 16b. As shown in FIG. 6, drive end portions 48b, 48d provided at ends of the second and fourth drive beams 44b, 44d respectively, are connected to the movable beam 10 inbetween the supporting ends 16a, 16b and the first movable end 12. Fixed end portions 46b, 46d on the other ends of the second and fourth drive beams 44b, 44d respectively, are fixed on the insulating film 34. The second and fourth drive beams 44b, 44d include piezoelectric films 52b, 52d, bottom electrodes 50b, 50d, and top electrodes 54b, 54d. The piezoelectric films 52b and 52d are sandwiched between the bottom electrodes 50b, 50d, and the top electrodes 54b, 54d. In order to drive the second and fourth drive beams 44b, 44d, a drive voltage Vb is applied between the bottom electrodes 50b, 50d and the top electrodes 54b, 54d.

Distances from the supporting ends 16a, 16b of the movable beam 10 to the drive end portions 48a, 48b, 48c, 48d of the first to fourth drive beams 44a, 44b, 44c, 44d are denoted by L1 and are approximately equal, respectively, as shown in FIG. 1. A distance from the supporting ends 16a, 16b to the first movable end is denoted by L2. The width of the movable beam 10 is W1. Distances from the drive end portions 48a to 48d of the first to fourth drive beams 44a to 44d to the fixed end portions 46a, 46b, 46c, 46d are denoted by Lp and are approximately equal, respectively. Widths of the first to fourth drive beams 44a to 44d are denoted by Wp and are approximately equal, respectively.

Figure 7:
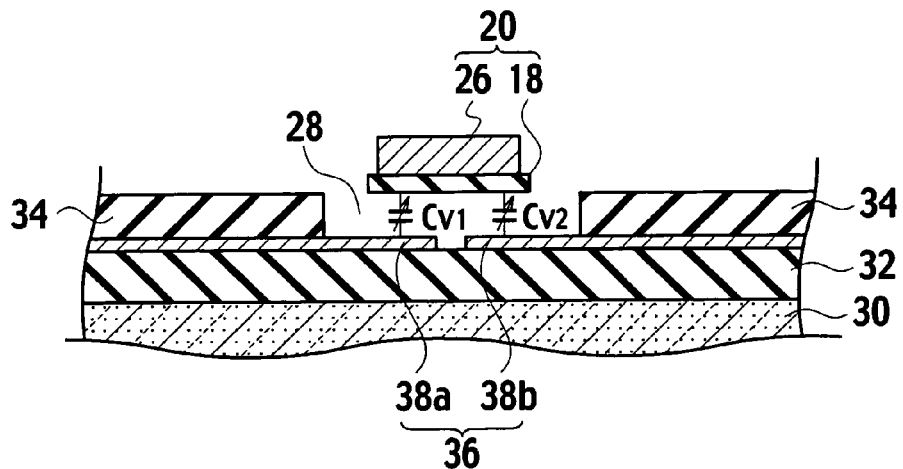
FIG. 7 is a schematic view showing an example of a cross section along a line VII—VII in the MEMS device of FIG. 1.

As shown in FIG. 7, the fixed electrode 36 includes first and second conductive films 38a, 38b disposed on the surface of the underlying film 32. The first and second conductive films 38a, 38b face the movable electrode 26 through the air gap 28. The variable capacitor according to the embodiment of the present invention provides capacitances Cv1 and Cv2 connected in series between the movable electrode 26 and the first and second conductive films 38a, 38b, respectively. The capacitances Cv1 and Cv2 vary according to a variation in the distance between the fixed electrode 36 and the movable electrode 26.

As the substrate 30, an insulating glass substrate, a semiconductor substrate such as silicon (Si), and the like is used. As the underlying film 32, an insulating film such as silicon oxide ($SiO_2$) is used. For the supporting film 18 and the insulating film 34, an insulating film such as $SiO_2$, silicon nitride ($Si_3N_4$), is used. A metal is used for the movable electrode 26, the first and second conductive films 38a, 38b, the bottom electrodes 50a to 50d, and the top electrodes 54a to 54d. The metal may be a low resistance, such as aluminum (Al), gold (Au), platinum (Pt), copper (Cu), iridium (Ir), tungsten (W), and molybdenum (Mo). A piezoelectric material such as aluminum nitride (AlN), zinc oxide (ZnO), lead zirconate titanate (PZT) or barium titanate (BTO) is used for the piezoelectric films 52a to 52d. Further, as the reinforcing film 24, the same metal as that of the movable electrode 26 is used. However, the reinforcing film 24 may be an insulator, a semiconductor, and the like.

As shown in FIGS. 5 and 6, in the actuator according to the embodiment, the drive voltage Va is applied to the first and third drive beams 44a, 44c. The drive voltage Vb is applied to the second and fourth drive beams 44b, 44d. For example, in an initial state, both the drive voltages Va and Vb are V0. When the first to fourth drive beams 44a to 44d are in a bent state, the drive voltages Va and Vb are (V0+V1) and (V0−V1), respectively. When the drive voltages Va and Vb are V0, the first to fourth drive beams 44a to 44d are straight and unbent. When the drive voltages Va and Vb are (V0+V1), the drive end portions 48a to 48d of the first to fourth drive beams 44a to 44d, fixed to the insulating film 34 at the fixed end portions 46a to 46d, bend toward the substrate 30 so as to contact the underlying film 32. Further, when the drive voltages Va and Vb are (V0−V1), the drive end portions 48a to 48d of the first to fourth drive beams 44a to 44d bend in a direction away from the substrate 30.

Figure 8:
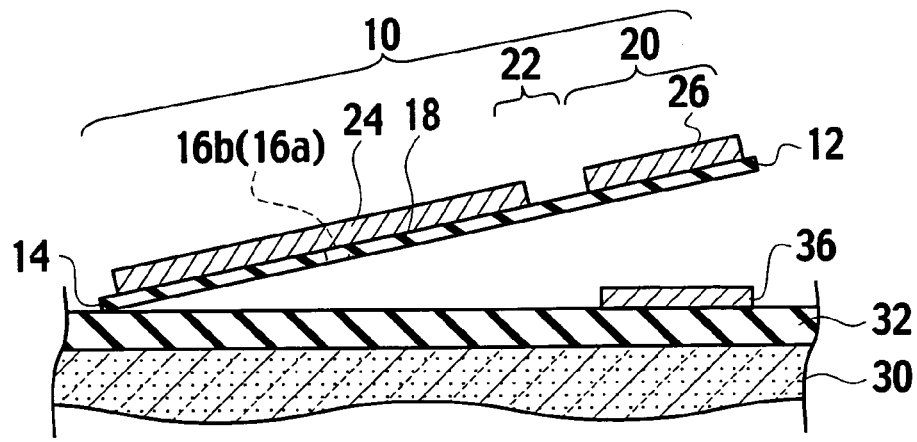
FIG. 8 is a schematic view showing an example of the operation of the actuator according to the embodiment of the present invention.

By applying (V0+V1) for the drive voltage Va, the first and third drive beams 44a, 44c are bent toward the substrate 30. At the same time, by applying (V0−V1) for the drive voltage Vb, the second and fourth drive beams 44b, 44d are bent in a direction away from the substrate 30. Consequently, as shown in FIG. 8, with the supporting ends 16a, 16b as a pivot point, the movable electrode 26 moves away from the fixed electrode 36, and the second movable end 14 contacts the underlying film 32. Thus, the capacitive coupling between the first and second conductive films 38a, 38b is minimized.

Figure 9:
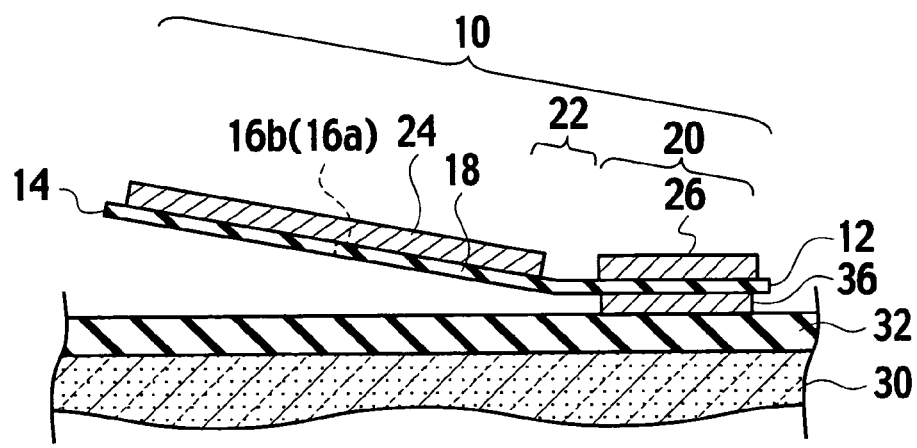
FIG. 9 is a schematic view showing another example of the operation of the actuator according to the embodiment of the present invention.

By applying (V0−V1) for the drive voltage Va, the first and third drive beams 44a, 44c are bent in a direction away from the substrate 30. At the same time, by applying (V0+V1) for the drive voltage Vb, the second and fourth drive beams 44a, 44c are bent toward the substrate 30. Consequently, as shown in FIG. 9, with the supporting ends 16a, 16b as a pivot point, the supporting film 18 under the movable electrode 26 contacts the fixed electrode 36. Thus, the capacitive coupling between the first and second conductive films 38a, 38b is maximized.

For example, the voltages V0 and V1 are assumed to be 0 V and 3 V, respectively. Alternatively, both of the voltages V0 and V1 may be 1.5 V. Note that the drive voltages Va and Vb are potential differences between the top electrodes 54a to 54d and the bottom electrodes 50a to 50d. When the bottom electrodes 50a to 50d are at a ground potential (0 V), the drive voltages Va and Vb are equal to the voltages applied to the top electrodes 54a to 54d. However, the voltages applied to the bottom electrodes 50a to 50d may be voltages other than the ground potential. For example, in order to achieve a bending state of the movable beam 10, voltages of 3 V and 0 V are applied to the top electrodes 54a, 54c and the bottom electrodes 50a, 50c, respectively, as the drive voltage Va, and voltages of 0 V and 3 V are applied to the top electrodes 54b, 54d and the bottom electrodes 50b, 50d, respectively, as the voltage Vb. Such a method of applying the drive voltages Va and Vb can be adopted even in a system in which a negative voltage cannot be used.

In the variable capacitor according to the embodiment, capacitance between the movable electrode 26 and the fixed electrode 36 can be digitally changed by moving the movable beam 10 of the actuator in a seesaw motion with the supporting ends 16a, 16b as pivot points. Further, if the drive voltages applied to the first to fourth drive beams 44a to 44d are controlled in an analog form, the capacitance between the movable electrode 26 and the fixed electrode 36 can also be continuously changed.

In the actuator according to the embodiment, in order to prevent the movable beam 10 from warping, the reinforcing film 24 is provided on the supporting film 18. Various types of forces can warp the first to fourth drive beams 44a to 44d in a vertical direction, with respect to the substrate 10. The warp forth may be due to temperature change in an operating environment, a residual stress induced by a film thickness variation and membrane stress, and the like. Since the movable beam 10 is prevented from warping, warpage of the first to fourth beams 44a to 44d are reduced. Accordingly, a fluctuation in the distance between the acting portion 20 and the fixed electrode 36 is reduced. Further, in the actuator according to the embodiment, the displacements of the first to fourth drive beams 44a to 44d are not directly used. The relative displacement between the first and third drive beams 44a, 44c, and the second and fourth drive beams 44b, 44d, are used. As a result, the influence of warpage due to a temperature change or a residual stress can be reduced.

Figure 10:
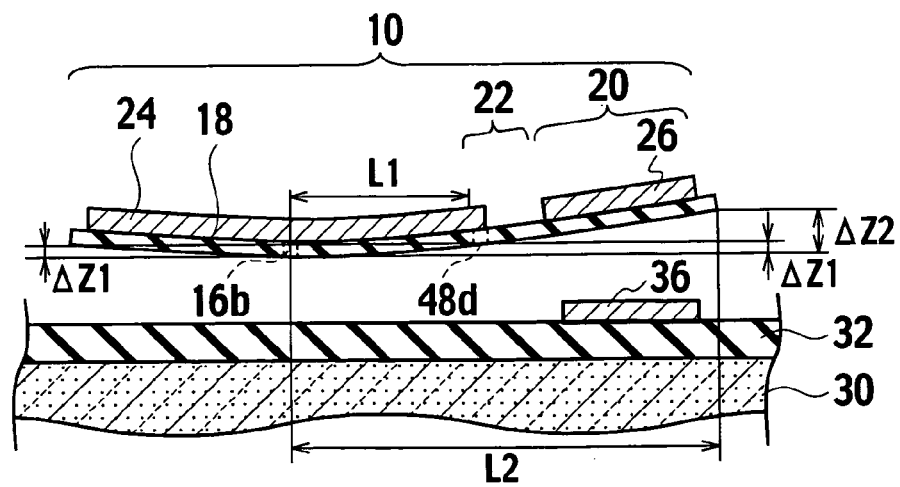
FIG. 10 is a schematic view showing an example of the warpage of the actuator according to the embodiment of the present invention.

The influence of warpage in the first to fourth drive beams 44a to 44d will be specifically described. For example, as shown in FIG. 10, the movable beam 10 supported by the supporting end 16b bends by an amount of warpage ΔZ1 at the drive end portion 48d and an amount of warpage ΔZ2 at the first movable end 12, under the influence of warpage of the second and fourth drive beams 44b, 44d (not shown). An amount of warpage of the second and fourth drive beams 44b, 44d when the second and fourth drive beams 44b, 44d are disconnected from the movable beam 10 at the drive end portions 48b and 48d are denoted as ΔZp. From the spring balanced relationship between the movable beam 10 and the second and fourth drive beams 44b, 44d connected to the movable beam 10 at the drive end portion 48d, the amount of warpage ΔZ1 is expressed as follows:

$$\Delta Z1 = \{2 \cdot kp/(k1+2 \cdot kp)\} \cdot \Delta Zp \quad (1)$$

Here, k1 is the effective stiffness of the movable beam 10 which has the supporting film 18 and the reinforcing film 24 between the supporting end 16b and the drive end portion 48d, and kp is the effective stiffness of the second drive beam 44b. The fourth drive beam 44d also has the same stiffness kp.

Moreover, the warpage amounts ΔZ1 and ΔZ2 satisfy the following relationship:

$$\Delta Z2 < \{(L1+L2)/L1\}^2 \cdot \Delta Z1 \quad (2)$$

From the expressions (1) and (2), ΔZ2<ΔZp when the following relationship is satisfied:

$$\{(L1+L2)/L1\}^2 \{2 \cdot kp/(k1+2 \cdot kp)\} < 1 \quad (3)$$

More specifically, when the expression (3) is satisfied, the warpage of the movable beam 10 can be reduced compared to a piezoelectric actuator having the same structure as the fourth drive beam 44d.

For example, in the case where L1=L2, the following relationship is obtained from the expression (3):

$$k1 > 6 \cdot kp \quad (4)$$

For example, an effective Young's modulus of a multilayer film of the movable beam 10 including the supporting film 18 and the reinforcing film 24 is denoted as E1, and the thickness of the multilayer film of the movable beam 10 is denoted as t1. Further, an effective Young's modulus of a multilayer film of the first to fourth drive beams 44a to 44d including the supporting film 18, the bottom electrodes 50a to 50d, the piezoelectric films 52a to 52d, and the top electrodes 54a to 54d, is denoted as Ep, and the thickness of the multilayer film of the first to fourth drive beams 44a to 44d is denoted as tp. The stiffnesses k1 and kp are expressed as follows:

$$k1 = (1/4) \cdot E1 \cdot W1 \cdot (t1/L1)^3 \quad (5)$$

$$kp = (1/4) \cdot Ep \cdot Wp \cdot (tp/Lp)^3 \quad (6)$$

Substituting the expressions (5) and (6) into the expression (4) yields the following relationship:

$$E1 \cdot W1 \cdot (t1/L1)^3 > 6 \cdot Ep \cdot Wp \cdot (tp/Lp)^3 \quad (7)$$

The structures and materials of the supporting film 18 and the reinforcing film 24 of the movable beam 10 may be determined based on the expression (7).

Further, as shown in FIG. 9, the capacitive coupling between the first and second conductive films 38a and 38b is maximized by bringing the supporting film 18, under the movable electrode 26, into contact with the fixed electrode 36 with no space between the supporting film 18 and the fixed electrode 36. The reinforcing film 24 and the movable electrode 26 are not provided in a region of the movable beam 10 from the drive end portions 48b and 48d of the second and fourth drive beams 44b, 44d to the front of the movable electrode 26, i.e., the connecting portion 22. Therefore, the connecting portion 22 can be easily bent. For example, it is desirable that the stiffness k2 of the connecting portion 22 is smaller than the stiffness kp of the first to fourth drive beams 44a to 44d. For example, the material constant of the supporting film 18 and the size of the connecting portion 22 may be determined so that the stiffness k2 is ½ or less of the stiffness kp.

Figure 11:
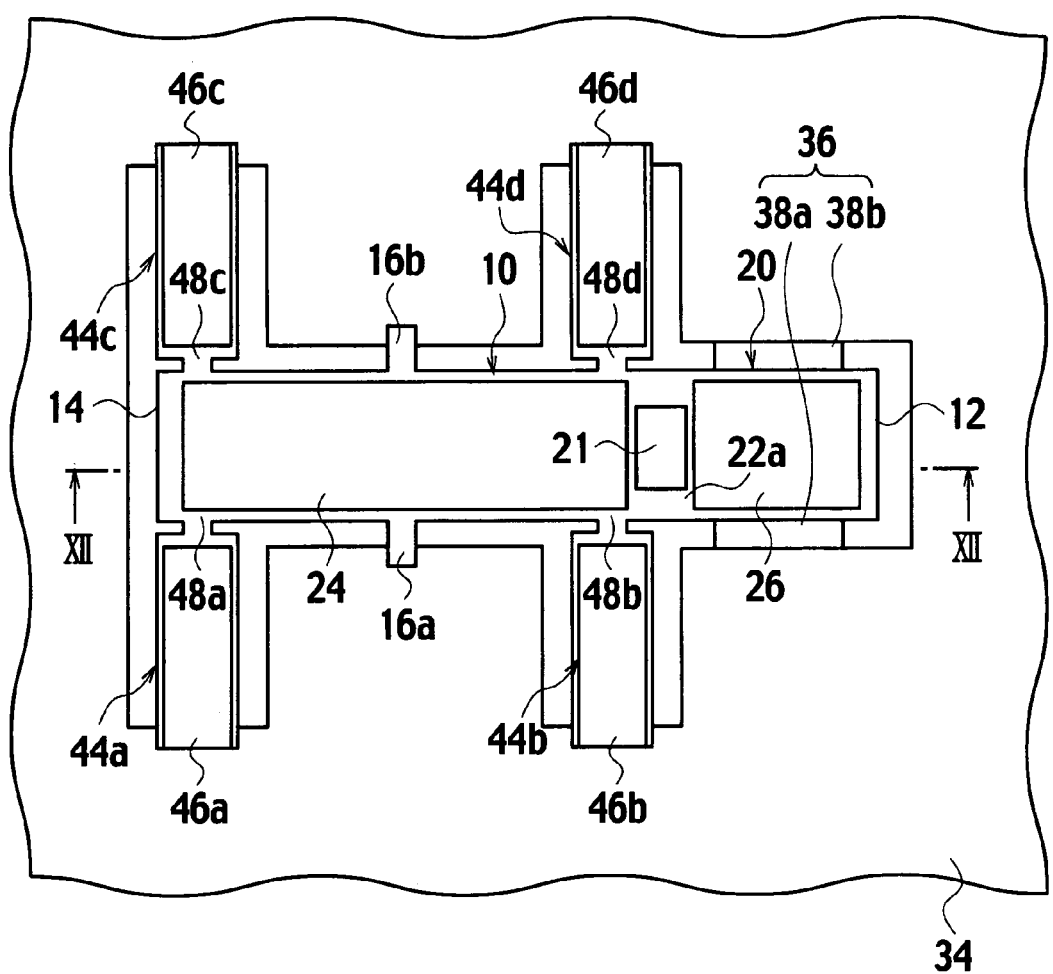
FIG. 11 is a schematic plan view showing another example of the MEMS device according to the embodiment of the present invention.
Figure 12:
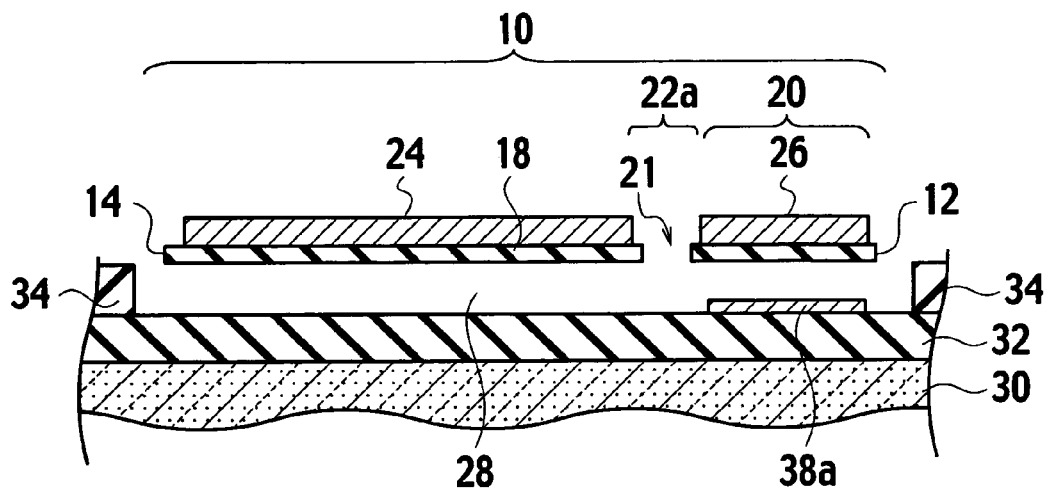
FIG. 12 is a schematic view showing an example of a cross section along a line XII—XII in the MEMS device of FIG. 11.

Moreover, it is desirable to provide an opening portion 21 in a connecting portion 22a of the movable beam 10, as shown in FIGS. 11 and 12. The effective width of the supporting film 18 in the connecting portion 22a with the opening portion 21 is reduced. Therefore, the stiffness k2 of the connecting portion 22a can be reduced. As a result, the acting portion 20 can uniformly contact the fixed electrode 36 with no space between the acting portion 20 and the fixed electrode 36. Note that, instead of the opening portion 21, a groove may be provided in the connecting portion 22 in order to reduce the stiffness k2 of the connecting portion 22. Alternatively, recesses may be provided in the connecting portion 22 so as to reduce the width of the movable beam 10 in the connecting portion 22.

Further, film thickness variations may occur within a plane on the substrate 30 and between deposition lots. However, film thickness can be regarded as approximately constant in a minute area having a size approximately equal to the movable beam 10 within the plane on the substrate 30. Accordingly, there is almost no difference in the residual stress due to the film thickness variation between the first to fourth drive beams 44a to 44d. Similarly, the membrane stress, Young's modulus, and the like, are also approximately constant within the minute area having a size approximately equal to that of the movable beam 10. Thus, there is almost no difference in the amount of warpage between the first to fourth drive beams 44a to 44d. Therefore, the amount of displacement in the acting portion 20 of the movable beam 10 can be precisely controlled.

Figure 13:
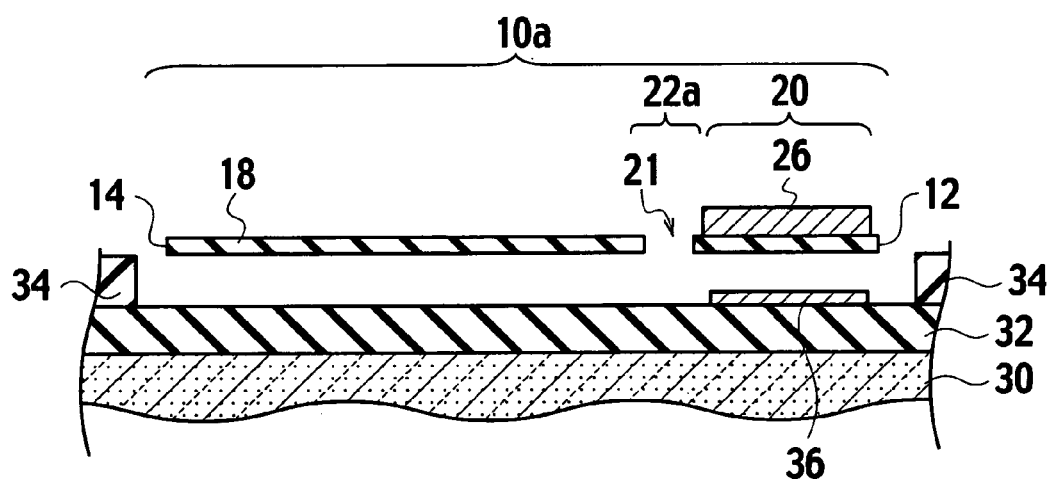
FIG. 13 is a schematic plan view showing another example of the MEMS device according to the embodiment of the present invention.

Moreover, as shown in FIG. 13, in the case where the supporting film 18 is sufficiently hard so that the stiffness of the supporting film 18 satisfies the expression (4), a movable beam 10a without a reinforcing film may be used. The movable beam 10a includes the connecting portion 22a in which the opening portion 21 is provided. By reducing the effective width of the supporting film 18 of the connecting portion 22a, the stiffness of the connecting portion 22a can be reduced so that the acting portion 20 uniformly contacts the fixed electrode 36 without any clearance therebetween.

Figure 14:
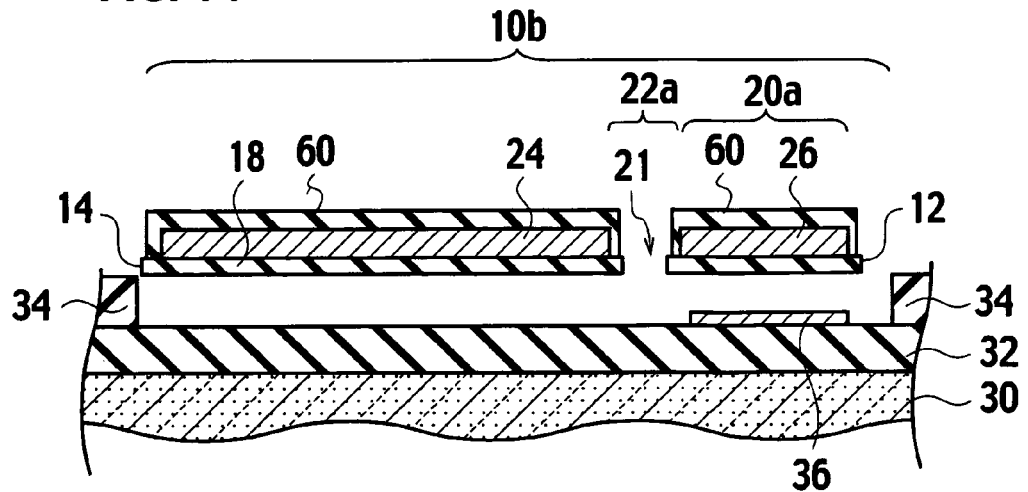
FIG. 14 is a schematic plan view showing another example of the MEMS device according to the embodiment of the present invention.

Additionally, it is desirable that the thermal expansion coefficients of the supporting film 18 and the reinforcing film 24 are approximately equal in order to prevent the movable beam 10 from warping due to a temperature change. When the thermal expansion coefficients of the supporting film 18 and the reinforcing film 24 may vastly differ, as shown in FIG. 14, a compensating film 60 of the same material as the supporting film 18 is provided on the reinforcing film 24. Further, the compensating film 60 is also provided on the movable electrode 26 of an acting portion 20a. The thermal expansion coefficient of the movable beam 10b is symmetrical with respect to the reinforcing film 24 in the vertical direction, and the warpage due to an environmental temperature change can be reduced.

(First Modification)

Figure 15:
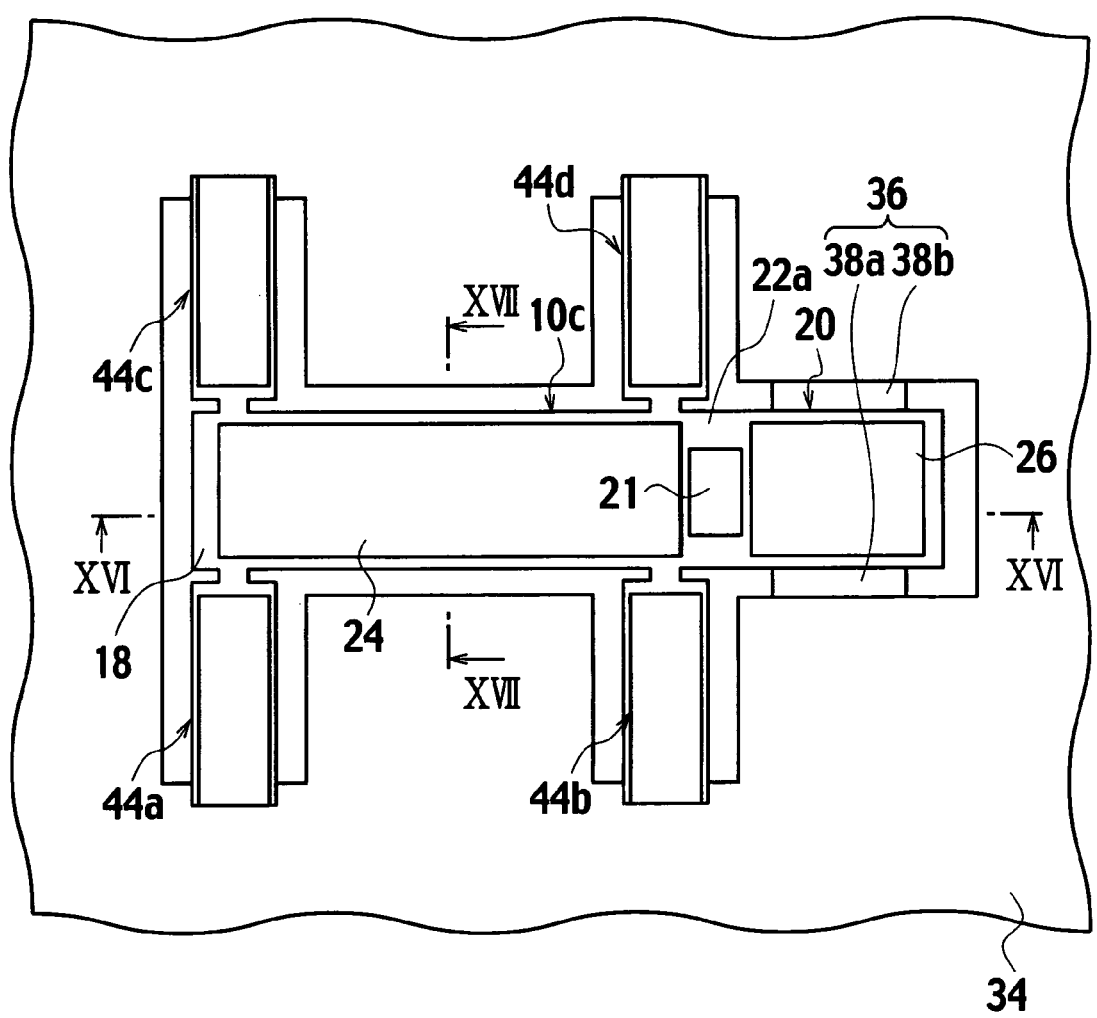
FIG. 15 is a schematic plan view showing an example of the MEMS device according to a first modification of the embodiment of the present invention.

A variable capacitor using an actuator according to a first modification of the embodiment of the present invention includes a movable beam 10c with the acting portion 20 at an end portion thereof, as shown in FIG. 15. The movable beam 10c includes the supporting film 18 on which the reinforcing film 24 and the movable electrode 26 are provided. The reinforcing film 24 is placed on an opposite side of the movable electrode 26 that is provided in the acting portion 20 with respect to the connecting portion 22a. An opening portion 21 is provided in the connecting portion 22a.

Figure 16:
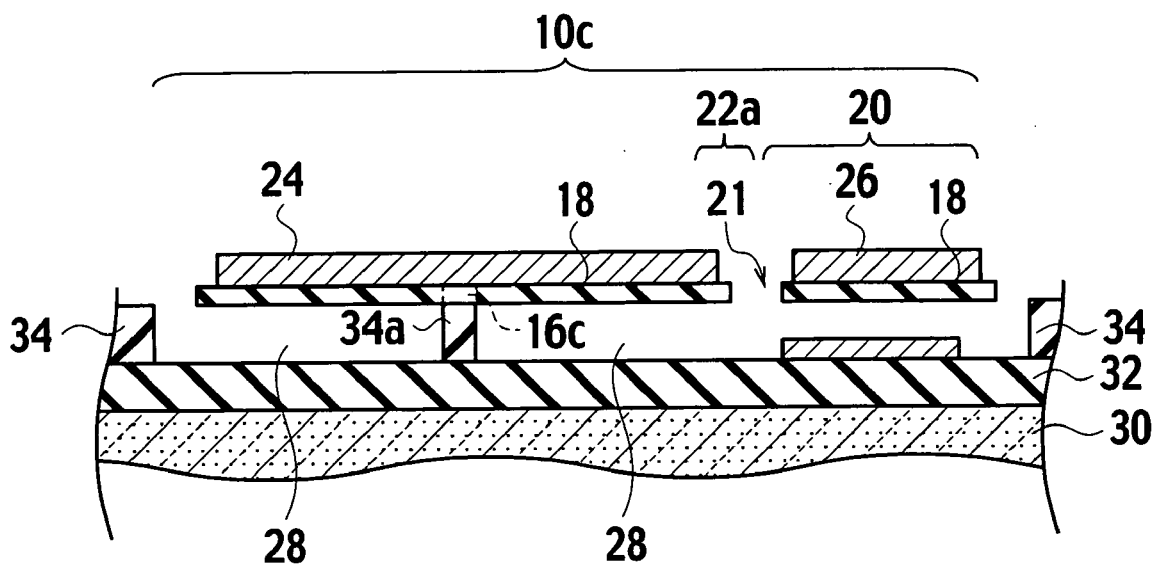
FIG. 16 is a schematic view showing an example of a cross section along a line XVI—XVI in the MEMS device of FIG. 15.
Figure 17:
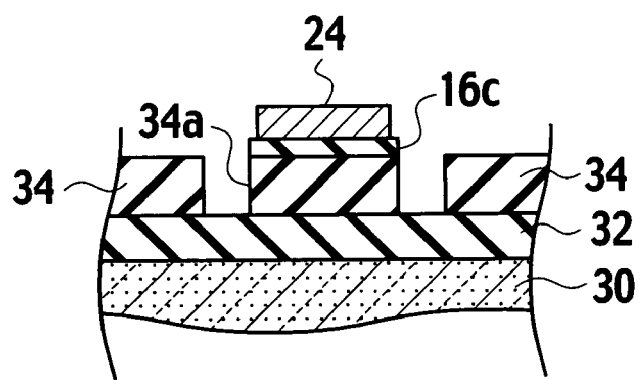
FIG. 17 is a schematic view showing an example of a cross section along a line XVII—XVII in the MEMS device of FIG. 15.

As shown in FIGS. 16 and 17, in the movable beam 10c, a supporting portion 16c is provided at a position spaced from the acting portion 20. The first and third drive beams 44a, 44c are connected to an end portion of the movable beam 10c. The second and fourth drive beams 44b, 44d are connected to the movable beam 10c adjacent to the connecting portion 22a. The pairs of drive beams are arranged in a mirror symmetry with respect to the supporting portion 16c. An insulating film 34a on the underlying film 32 on a surface of the substrate 30 is provided beneath the supporting portion 16c.

The actuator according to the first modification of the embodiment of the present invention differs from the embodiment of the present invention in that the insulating film 34a is placed under the supporting portion 16c of the movable beam 10c. Other configurations are as in the embodiment of the present invention, so duplicated descriptions are omitted.

In the first modification of the embodiment, the movable beam 10c is supported by the insulating film 34a provided beneath the supporting portion 16c. Therefore, it is possible to prevent the position of the movable beam 10c from varying in the vertical direction with respect to the substrate 30. As a result, the pressing force of the acting portion 20 on the fixed electrode 36 is increased.

(Second Modification)

Figure 18:
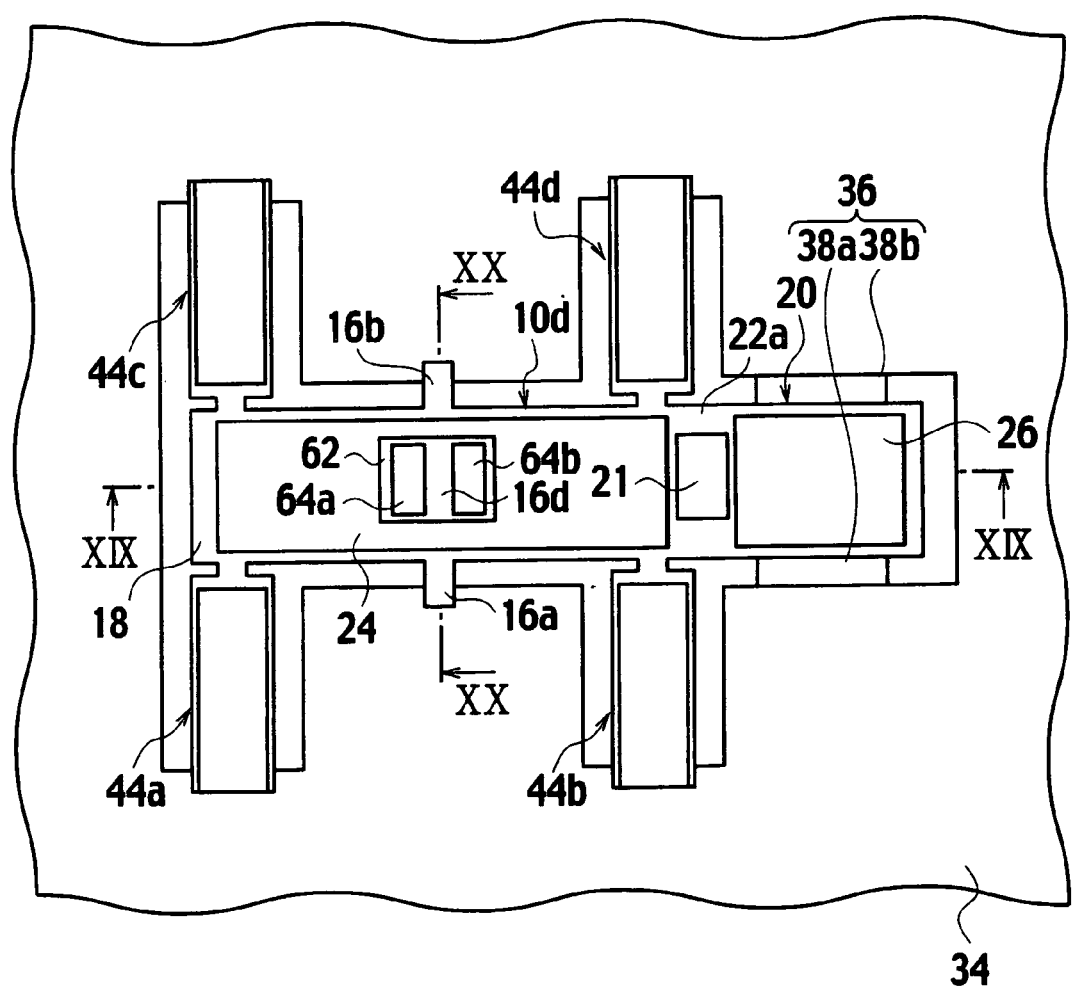
FIG. 18 is a schematic plan view showing an example of the MEMS device according to a second modification of the embodiment of the present invention.

A variable capacitor using an actuator according to a second modification of the embodiment of the present invention includes a movable beam 10d that has the acting portion 20 at an end portion thereof, as shown in FIG. 18. The movable beam 10d includes the supporting film 18 on which the reinforcing film 24 and the movable electrode 26 are provided.

Figure 19:
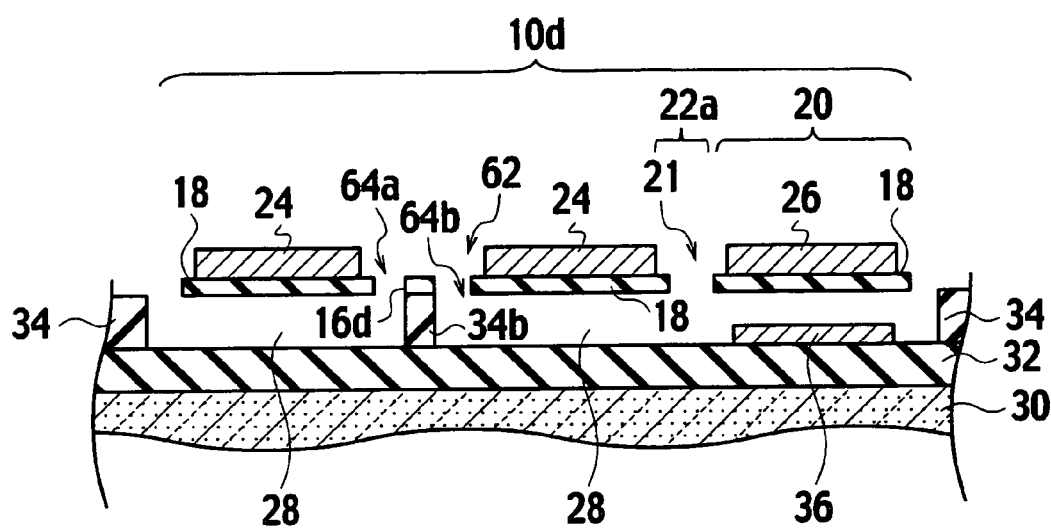
FIG. 19 is a schematic view showing an example of a cross section along a line XIX—XIX in the MEMS device of FIG. 18.
Figure 20:
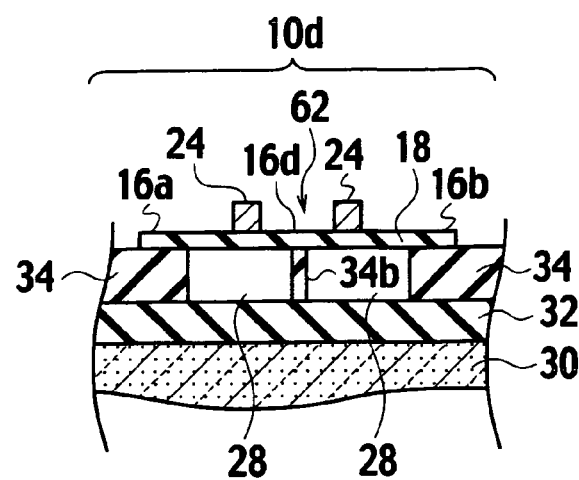
FIG. 20 is a schematic view showing an example of a cross section along a line XX—XX in the MEMS device of FIG. 18.

In the movable beam 10d, supporting ends 16a, 16b, and 16d are provided at a portion of the movable beam 10d spaced from the acting portion 20. The stiffness of the movable beam 10d is reduced in adjacent regions on either side of the supporting portion 16d. For example, an opening portion 62 is provided in the reinforcing film 24 of the movable beam 10d so as to include the supporting portion 16d. Further, opening portions 64a, 64b are provided in the supporting film 18 so as to face each other across the supporting portion 16d inside the opening portion 62. As shown in FIGS. 19 and 20, insulating films 34, 34b on the underlying film 32 on a surface of the substrate 30 are provided beneath the supporting ends 16a, 16b, 16d.

The actuator according to the second modification of the embodiment of the present invention differs from the embodiment and the first modification in that the opening portions 64a, 64b facing each other across the supporting portion 16d are provided inside the opening portion 62 in which the supporting portion 16d is included on the insulating film 34b. Other configurations are as in the embodiment and the first modification of the embodiment of the present invention, so duplicated descriptions are omitted.

In the second modification of the embodiment, the movable beam 10d is supported by the insulating film 34 placed beneath the opposite end portions of the supporting ends 16a and 16b and the insulating film 34b placed beneath the supporting portion 16d. Therefore, it is possible to prevent the position of the movable beam 10d from varying in the vertical direction with respect to the substrate 30. Further, by providing the opening portions 62, 64a, and 64b, the stiffness of the movable beam 10d can be reduced in the vicinity of the supporting portion 16d. As a result, the movable beam 10d can be easily bent.

(Third Modification)

Figure 21:
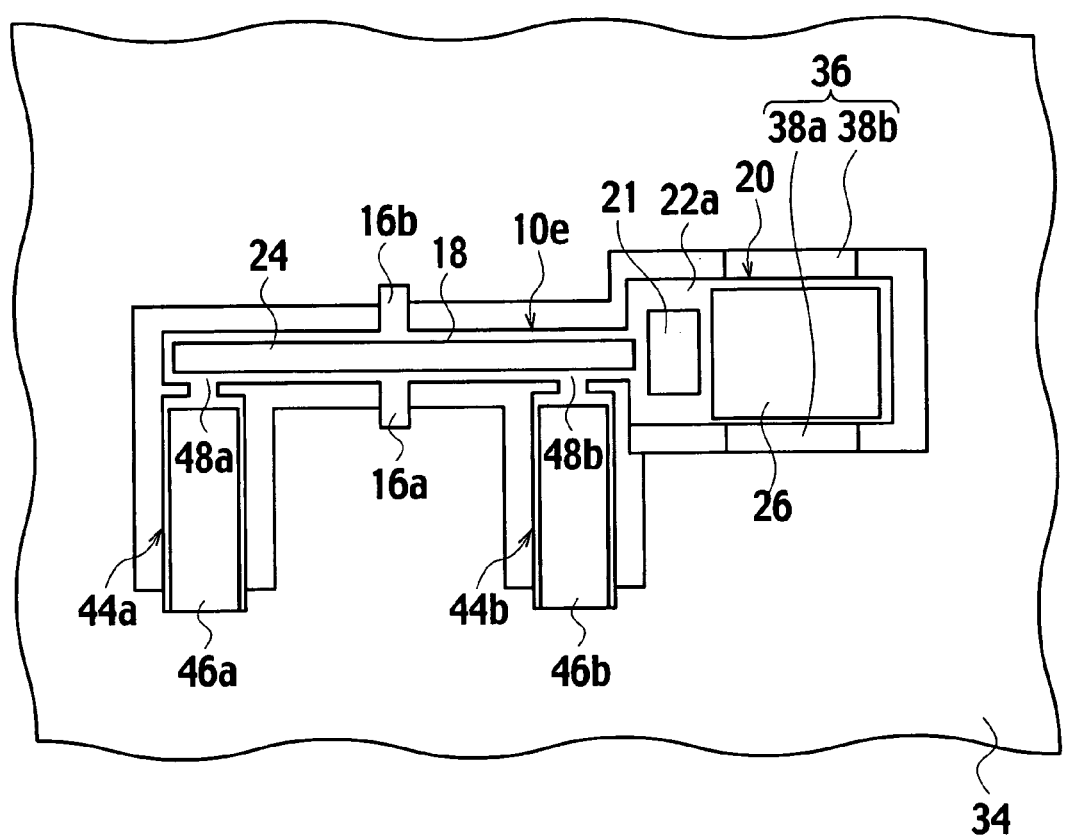
FIG. 21 is a schematic plan view showing an example of the MEMS device according to a third modification of the embodiment of the present invention.

A variable capacitor using an actuator according to a third modification of the embodiment of the present invention includes a movable beam 10e that has the acting portion 20 at an end portion of the movable beam 10e, as shown in FIG. 21. The first and second drive beams 44a, 44b fixed on the insulating film 34 at the fixed end portions 46a, 46b are connected to the movable beam 10e at the drive end portions 48a, 48b.

The actuator according to the third modification of the embodiment differs from the embodiment in that the first and second drive beams 44a, 44b are connected to the movable beam 10e. Other configurations are as in the embodiment of the present invention, so duplicated descriptions are omitted.

In the third modification of the embodiment, the actuator is driven by the first and second drive beams 44a and 44b placed on one side of the movable beam 10e. Accordingly, the structure of the actuator of the variable capacitor is simplified. Thus, the manufacturing yield can be increased. Further, the area occupied by the actuator of the variable capacitor can be reduced. Thus, the product cost can be decreased.

In the third modification of the embodiment of the present invention, when the stiffness of the first or second drive beam 44a, 44b is denoted by kp', and an inequality corresponding to the expression (4) may be as follows:

$$k1 > 3 \cdot kp' \tag{8}$$

(Fourth Modification)

Figure 22:
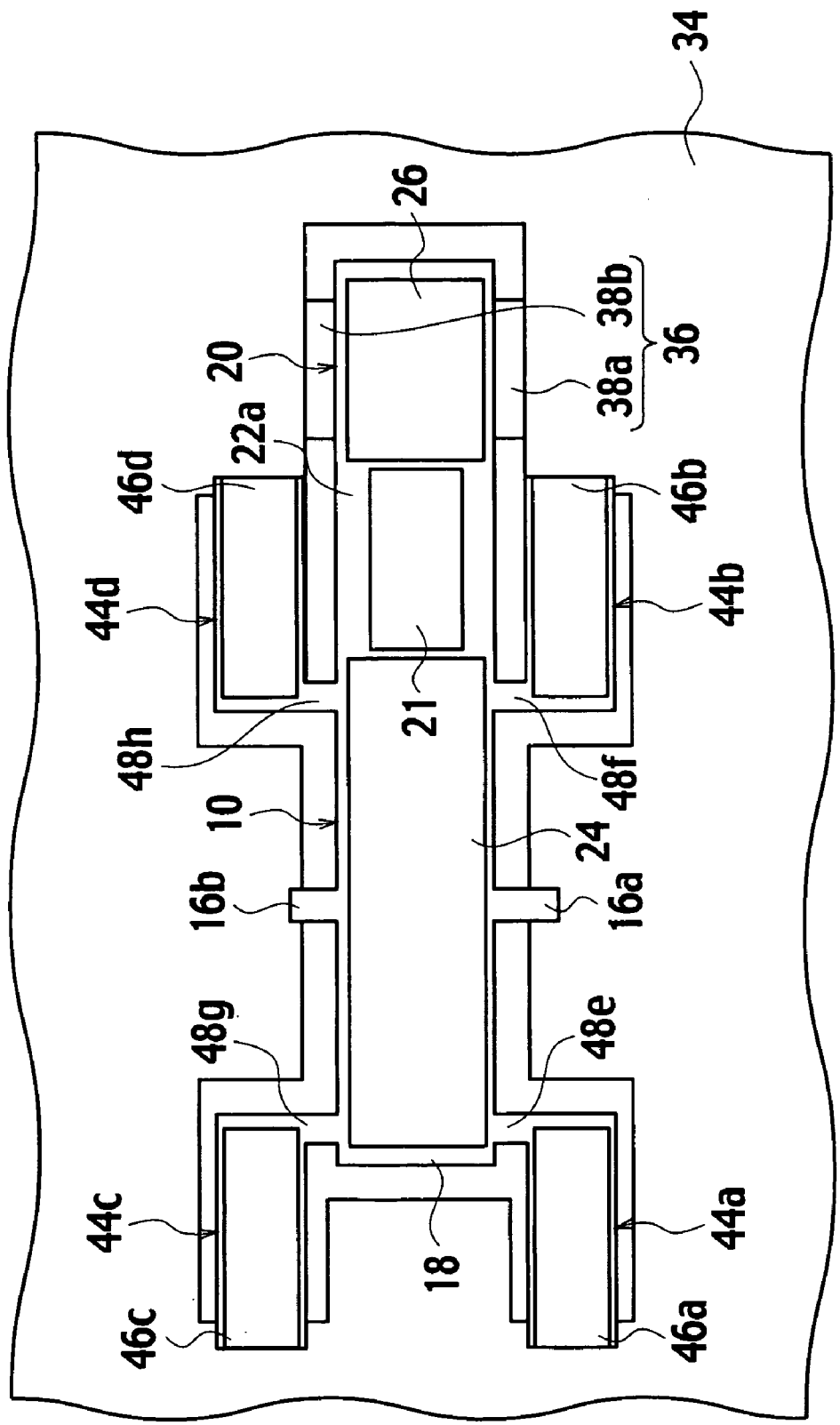
FIG. 22 is a schematic plan view showing an example of the MEMS device according to a fourth modification of the embodiment of the present invention.

In a variable capacitor using an actuator according to a fourth modification of the embodiment of the present invention, the first to fourth drive beams 44a to 44d are connected to the movable beam 10 at drive end portions 48e to 48h provided in parallel along the movable beam 10, as shown in FIG. 22. For example, the first and third drive beams 44a, 44c are placed on a side of the supporting ends 16a, 16b and the drive end portions 48e, 48g are between the drive beams 44a, 44c and the supporting ends 16a, 16b. The second and fourth drive beams 44b, 44d are placed on an opposite side of the supporting ends 16a, 16b with the drive end portions 48f, 48h therebetween.

The actuator according to the fourth modification of the embodiment of the present invention differs from the embodiment of the present invention in that the first to fourth drive beams 44a to 44d are provided in parallel along the movable beam 10. Other configurations are as in the embodiment of the present invention, so duplicated descriptions are omitted.

In the fourth modification of the embodiment of the present invention, since the first to fourth drive beams 44a to 44d are provided in parallel along the movable beam 10, the area occupied by the actuator of the variable capacitor can be reduced. Thus, the product cost can be decreased.

Figure 23:
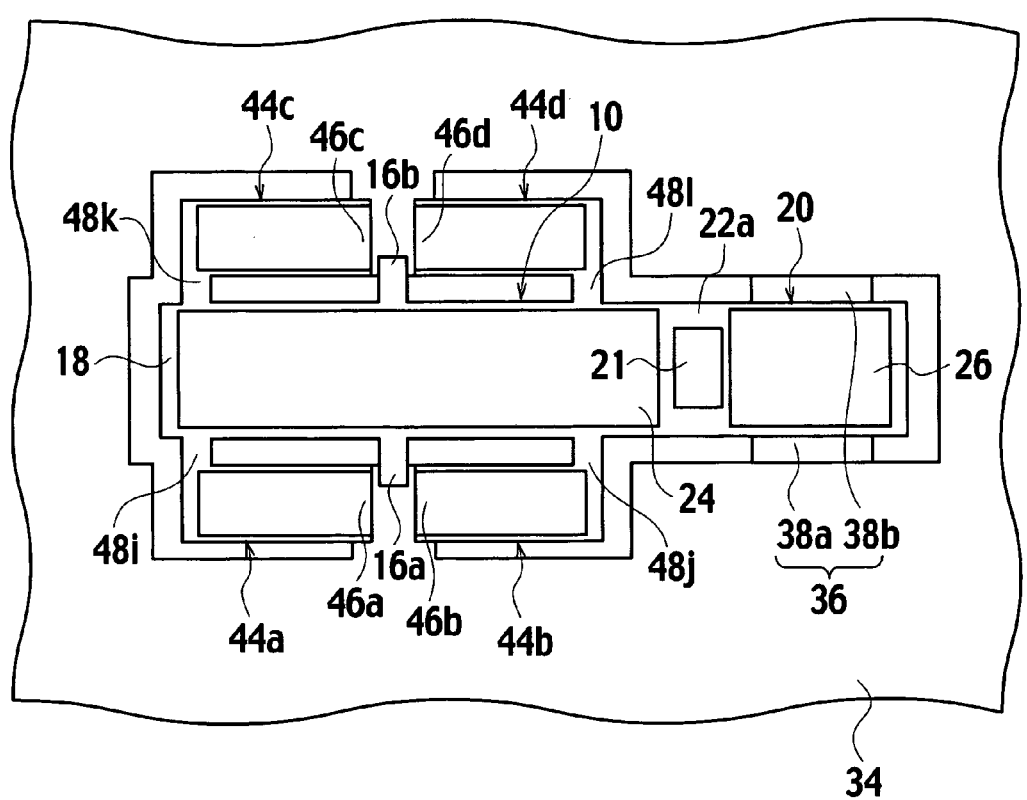
FIG. 23 is a schematic plan view showing another example of the MEMS device according to the fourth modification of the embodiment of the present invention.

In addition, as shown in FIG. 23, the first to fourth drive beams 44a to 44d may be placed on the same side of the supporting ends 16a and 16b with respect to the drive end portions 48i to 48l. In such a case, the area occupied by the actuator is further reduced. Further, the first to fourth drive beams 44a to 44d may be placed in an arbitrary direction.

(Fifth Modification)

Figure 24:
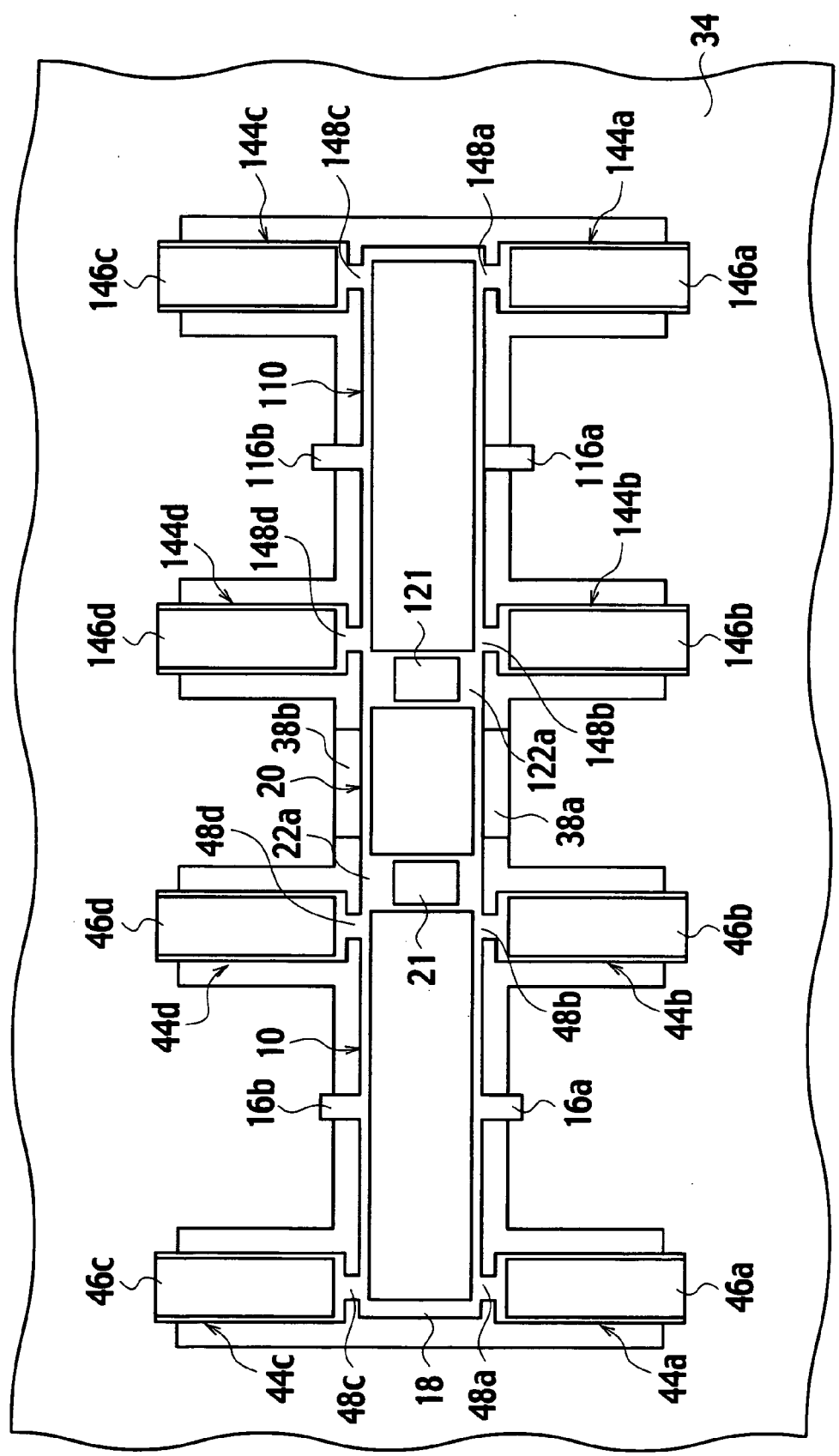
FIG. 24 is a schematic plan view showing an example of the MEMS device according to a fifth modification of the embodiment of the present invention.

In a variable capacitor using an actuator according to a fifth modification of the embodiment of the present invention, as shown in FIG. 24, a pair of actuators shown in FIG. 11 are respectively placed on opposite sides of the acting portion 20 so as to share the acting portion 20. For example, a movable beam 110 and first to fourth drive beams 144a to 144d face the movable beam 10 and the first to fourth drive beams 44a to 44d with respect to the acting portion 20, respectively.

Supporting portions 116a, 116b and a connecting portion 122a of the movable beam 110 face the supporting portions 16 and a connecting portion 22a of the movable beam 10. In the connecting portion 122a, an opening portion 121 faces the opening portion 21 of the connecting portion 22a. The first to fourth drive beams 144a, 144b, 144c, 144d are fixed to the insulating film 34 at fixed end portions 146a, 146b, 146c, 146d and are connected to the movable beam 110 at drive end portions 148a, 148b, 148c, 148d, respectively.

The actuator according to the fifth modification of the embodiment of the present invention differs from the embodiment of the present invention in that the pair of actuators is provided in a mirror symmetry by sharing the acting portion 20. Other configurations are as in the embodiment of the present invention, so duplicated descriptions are omitted.

In the fifth modification of the embodiment, the acting portion 20 is displaced by the actions of the movable beams 10 and 110, which face each other. Accordingly, the driving force of the actuator may be doubled. Thus, the displacement of the acting portion 20 can be more stably controlled to provide consistent results.

As shown in FIG. 24, the movable beam 10, the first to fourth drive beams 44a to 44d, the movable beam 110, and the first to fourth drive beams 144a to 144d, are arranged in a mirror symmetry with respect to the acting portion 20. However, the movable beam 10, the first to fourth drive beams 44a to 44d, the movable beam 110, and the first to fourth drive beams 144a to 144d, may be provided asymmetrically by sharing the acting portion 20.

OTHER EMBODIMENTS

Figure 25:
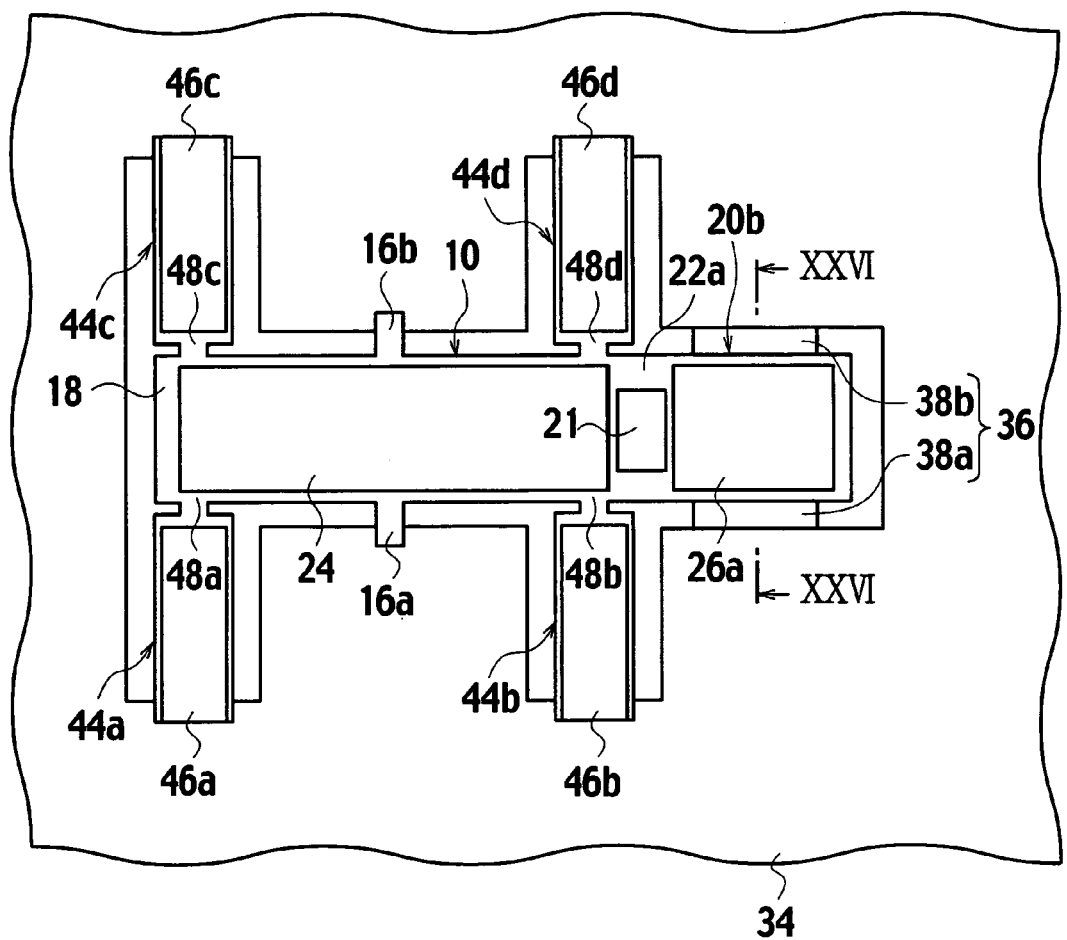
FIG. 25 is a schematic plan view showing an example of the MEMS device according to another embodiment of the present invention.
Figure 26:
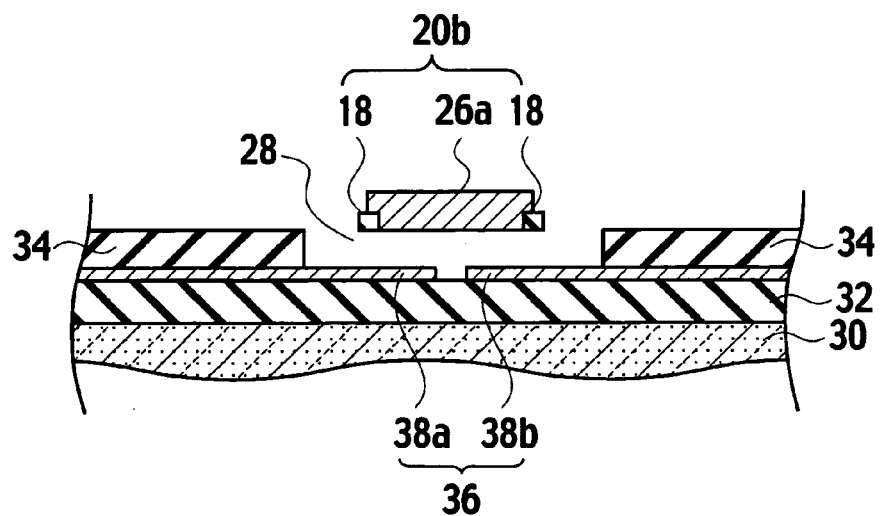
FIG. 26 is a schematic view showing an example of a cross section along a line XXVI—XXVI in the MEMS device of FIG. 25.

The embodiment of the present invention has been described using a variable capacitor as a MEMS device. However, an actuator according to the embodiment of the present invention can also be applied to a micro switch. For example, as shown in FIG. 25, a micro switch includes an actuator having a movable electrode 26a, and the fixed electrode 36. The movable electrode 26a is located in an acting portion 20b of the movable beam 10. As shown in FIG. 26, the movable electrode 26a is provided so as to penetrate the supporting film 18 and to face the first and second conductive films 38a and 38b of the fixed electrode 36 through the air gap 28. When the acting portion 20b is displaced to contact the fixed electrode 36, the first and second conductive films 38a and 38b are electrically connected through the movable electrode 26a.

Figure 27:
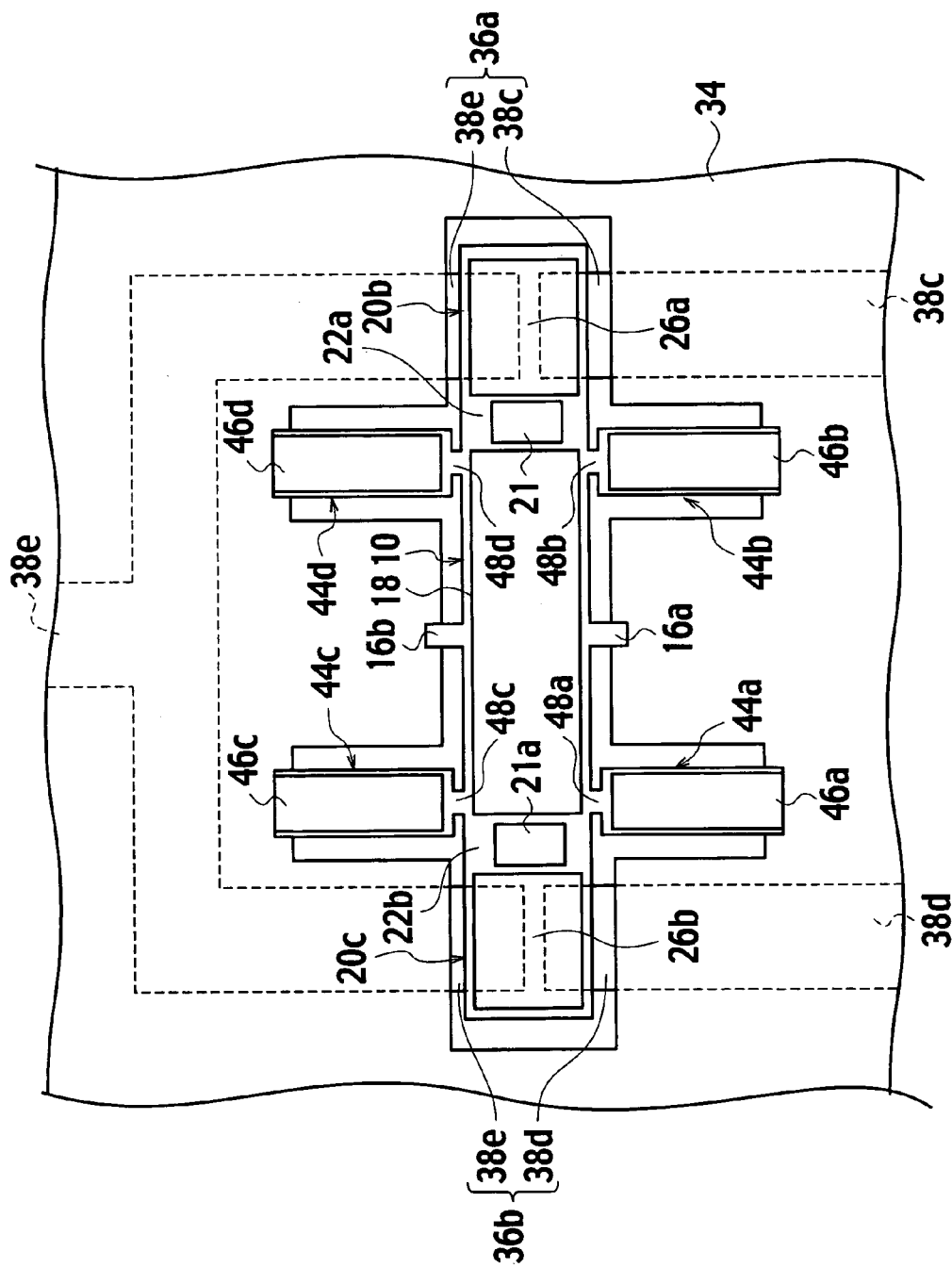
FIG. 27 is a schematic plan view showing another example of the MEMS device according to another embodiment of the present invention.

Further, as shown in FIG. 27, an actuator according to the embodiment of the present invention can also be applied to a single-pole double-throw (SPDT) switch by providing an acting portion 20c, which faces an acting portion 20b. The acting portion 20c is provided in the movable beam 10 and spaced from a connecting portion 22b in the vicinity of the first and third drive beams 44a, 44c. An opening portion 21a is provided in the connecting portion 22b. A movable electrode 26b is provided in the acting portion 20c. The movable electrode 26a of the acting portion 20b faces a fixed electrode 36a. The movable electrode 26b of the acting portion 20c faces a fixed electrode 36b. A first conductive film 38c (port 2) and a second conductive film 38e (port 1) are provided in the fixed electrode 36a to face each other. In the fixed electrode 36b, a first conductive film 38d (port 3) facing the common second conductive film 38e is provided.

The movable beam 10 is moved by the first to fourth drive beams 44a to 44d in a seesaw manner with the supporting ends 16a, 16b as a pivot point. For example, an input signal provided to port 1 is transmitted to port 2 when the movable electrode 26a of the acting portion 20b contacts the fixed electrode 36a. Further, the input signal is transmitted to port 3 when the movable electrode 26b of the acting portion 20c contacts the fixed electrode 36b. Thus, the input signal on port 1 can be switched over to transmit to port 2 and port 3.

Figure 28:
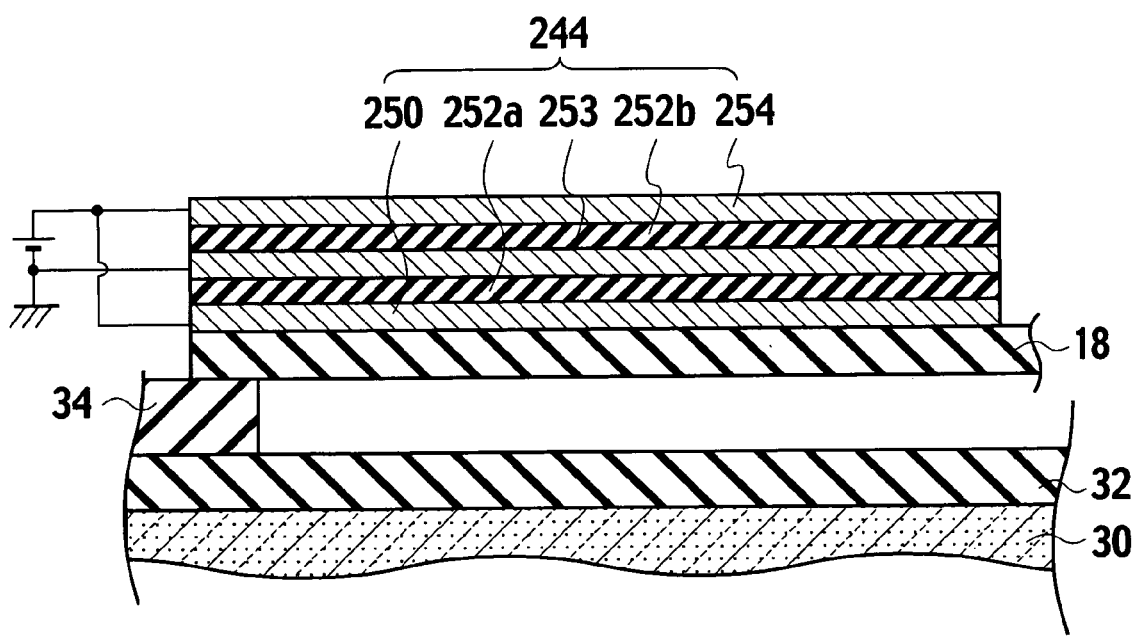
FIG. 28 is a schematic plan view showing an example of the drive beam according to another embodiment of the present invention.

Moreover, in the embodiment of the present invention, drive beams having a unimorph structure are used as the first to fourth drive beams 44a to 44d. However, drive beams having a bimorph structure may be used. As shown in FIG. 28, a drive beam 244 having a bimorph structure is provided on the supporting film 18. An intermediate electrode 253 is provided in the drive beam 244 between a first piezoelectric film 252a and a second piezoelectric film 252b. The first and second piezoelectric films 252a, 252b are sandwiched between a bottom electrode 250 and a top electrodes 254. For the intermediate electrode 253 of the drive beam 244 in a common potential, a drive voltage is applied to the bottom and top electrodes 250, 254, respectively. For example, when the first piezoelectric film 252a contracts, the second piezoelectric film 252b expands. As a result, the drive beam 244 bends toward the substrate 30. When the first piezoelectric film 252a expands, the second piezoelectric film 252b contracts. Thus, the drive beam 244, having a bimorph structure, can be used as the first to fourth drive beams 44a to 44d.

Additionally, as a driving force of the drive beams, contraction of a beam by thermal expansion may also be used instead of a piezoelectric effect. In such a case, the drive beams are provided with a bimetal-type structure, in which a current induces thermal expansion (Joule heat).

Various modifications are possible for those skilled in the art after storing the teachings of the present disclosure without departing from the scope thereof.

What is claimed is:

1. An actuator comprising:
a movable beam supported on a substrate by a supporting portion, the movable beam having a first movable end and a second movable end, the second movable end provided opposite to the first movable end with respect to the supporting portion;
a first drive beam connected to the movable beam at around the second movable end of the movable beam, the first drive beam fixed on the substrate at an end portion of the first drive beam; and
a second drive beam connected to the movable beam at a location between the supporting portion and the first movable end of the movable beam, the second drive beam fixed on the substrate at an end portion of the second drive beam.

2. The actuator of claim 1, further comprising:
a third drive beam connected to the movable beam at around the second movable end on an opposite side of the first drive beam with respect to the movable beam, the third drive beam fixed on the substrate at an end portion of the third drive beam; and
a fourth drive beam connected to the movable beam at a location between the supporting portion and the first movable end of the movable beam on an opposite side of the second drive beam with respect to the movable beam, the fourth drive beam fixed on the substrate at an end portion of the fourth drive beam.

3. The actuator of claim 1, wherein the movable beam is supported on the substrate at two supporting ends of the supporting portion, the supporting ends provided on opposite sides of the movable beam in a direction orthogonal to a longitudinal direction of the movable beam.

4. The actuator of claim 3, wherein the movable beam is supported on the substrate in a region between the supporting ends.

5. The actuator of claim 1, wherein an effective width of the movable beam between a connected portion of the second drive beam and the first movable end is narrower than a width of the movable beam.

6. The actuator of claim 1, wherein an effective width of the movable beam in adjacent regions on either side of the supporting portion is narrower than a width of the movable beam.

7. The actuator of claim 1, wherein each of the first and second drive beams includes a bottom electrode, a piezoelectric film on the bottom electrode, and a top electrode on the piezoelectric film.

8. The actuator of claim 1, wherein a stiffness of the movable beam at a location between a connected portion of the first or second drive beam and the supporting portion is more than three times greater than a stiffness of the first or second drive beam.

9. The actuator of claim 1, wherein a pair of the movable beams are provided on the substrate, the movable beams having a common acting portion connecting each of the first movable end of the movable beams.

10. A micro-electromechanical device, comprising:
a movable beam supported on a substrate by a supporting portion, the movable beam having a first movable end and a second movable end, the second movable end provided opposite to the first movable end with respect to the supporting portion;
a first drive beam connected to the movable beam at around the second movable end of the movable beam, the first drive beam fixed on the substrate at an end portion of the first drive beam;
a second drive beam connected to the movable beam at a location between the supporting portion and the first movable end of the movable beam, the second drive beam fixed on the substrate at an end portion of the second drive beam; and
a fixed electrode located above the substrate so as to face the first movable end.

11. The micro-electromechanical device of claim 10, further comprising:
a third drive beam connected to the movable beam a at around the second movable end on an opposite side of the first drive beam with respect to the movable beam, the third drive beam fixed on the substrate at an end portion of the third drive beam; and
a fourth drive beam connected to the movable beam at a location between the supporting portion and the first movable end of the movable beam on an opposite side of the second drive beam with respect to the movable beam, the fourth drive beam fixed on the substrate at an end portion of the fourth drive beam.

12. The micro-electromechanical device of claim 10, wherein the movable beam is supported on the substrate at two supporting ends of the supporting portion, the supporting ends provided on opposite sides of the movable beam in a direction orthogonal to a longitudinal direction of the movable beam.

13. The micro-electromechanical device of claim 12, wherein the movable beam is supported on the substrate in a region between the supporting ends.

14. The micro-electromechanical device of claim 10, wherein an effective width of the movable beam between a connected portion of the second drive beam and the first movable end is narrower than a width of the movable beam.

15. The micro-electromechanical device of claim 10, wherein an effective width of the movable beam in the vicinity of the supporting portion is narrower than a width of the movable beam.

16. The micro-electromechanical device of claim 10, wherein each of the first and second drive beams includes a bottom electrode, a piezoelectric film on the bottom electrode, and a top electrode on the piezoelectric film.

17. The micro-electromechanical device of claim 10, wherein a stiffness of the movable beam at a location between a connected portion of the first or second drive beam and the supporting portion is more than three times greater than a stiffness of the first or second drive beam.

18. The micro-electromechanical device of claim 10, wherein a pair of the movable beams are provided on the substrate, the movable beams having a common acting portion connecting each of the first movable end of the movable beams.

19. The micro-electromechanical device of claim 10, further comprising a movable electrode located on a surface of the movable beam so as to face the fixed electrode.

20. The micro-electromechanical device of claim 10, further comprising a movable electrode located on a surface of the movable beam so as to directly contact the fixed electrode.

* * * * *